United States Patent
Koga

(10) Patent No.: US 7,881,130 B2
(45) Date of Patent: Feb. 1, 2011

(54) SEMICONDUCTOR MEMORY DEVICE HAVING WRITE DATA THROUGH FUNCTION

(75) Inventor: Toshiro Koga, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 374 days.

(21) Appl. No.: 11/976,720

(22) Filed: Oct. 26, 2007

(65) Prior Publication Data

US 2008/0101136 A1    May 1, 2008

(30) Foreign Application Priority Data

Oct. 27, 2006    (JP)    .............................. 2006-292531

(51) Int. Cl.
*G11C 7/22*    (2006.01)

(52) U.S. Cl. ................. 365/189.14; 365/205; 365/233.1

(58) Field of Classification Search ............ 365/189.14, 365/205, 233.1
See application file for complete search history.

(56) References Cited

U.S. PATENT DOCUMENTS 6,665,208 B2 *    12/2003    Ogura et al. ................. 365/154

FOREIGN PATENT DOCUMENTS

JP    2004-199814    7/2004

* cited by examiner

*Primary Examiner*—Huan Hoang
(74) *Attorney, Agent, or Firm*—McGinn IP Law Group, PLLC

(57) ABSTRACT

A semiconductor memory device includes a switch that turns on or off connection between a write data line pair which is an output of a write buffer and read data line pair. For a Write Data Through function, the switch is turned on in response to an activated one-shot pulse and a sense amplifier activation signal, thereby approximately equalizing data hold time tOHW in the Write Data Through function and data hold time tOHR in a read operation.

7 Claims, 7 Drawing Sheets

SEMICONDUCTOR MEMORY DEVICE HAVING WRITE DATA THROUGH FUNCTION

BACKGROUND OF THE INVENTION

1. Field of the Invention

The present invention relates to a semiconductor memory device and, in particular, to a semiconductor memory device including a Write Data Through function which outputs input write data in a write operation.

2. Description of Related Art

FIG. 6 shows an example of a typical configuration of a semiconductor memory device. Digit lines and a portion surrounding an input and output circuits in the semiconductor memory device are mainly shown in FIG. 6. Referring to FIG. 6, PMOS transistors 301 and 302 having sources commonly connected to a power supply, gates commonly connected to a precharge control signal PC, and drains connected to digit lines DT and DB, respectively, are circuits that precharge the digit line pair DT/DB. A PMOS transistor 303 connected between the digit lines DT and DB and having a gate connected to the precharge control signal PC is a circuit that equalizes the digit line pair DT/DB. Each of digit line pairs DT [i]/DB [i] (where i is an integer in the range from 0 to c) is connected with multiple memory cells (not shown) and is selected by a word line (not shown) having a high electric potential. Y selectors 304, each of which is controlled to be turned on or off by a corresponding column select signal YSL [i] (where i is an integer in the range from 0 to c) among c+1 column select signals YSL [0:c] that are output from a column decoder, not shown, are connected to a common data line pair YDT/YDB. The Y selector (SEL) 304 may be implemented by an NMOS transistor that has a gate connected to a column select signal and is turned on when the column select signal is high, for example.

PMOS transistors 305 and 306 having sources commonly connected to a power supply, gates commonly connected to the precharge control signal PC, and drains connected to data lines YDT and YDB, respectively, are circuits that precharge the common data line pair YDT/YDB. A PMOS transistor 307 connected between the common data line pair YDT/YDB and having a gate connected to the precharge control signal PC is a circuit that equalizes the common data line pair YDT/YDB. The common data line pair YDT/YDB and a data line pair DLDT/DLDB on a sense amplifier 312 side are interconnected through a switch (transfer gate) 308.

PMOS transistors 309 and 310 having sources commonly connected to a power supply, gates commonly connected to the output of a NOR circuit 320, and drains connected to the data lines DLDT and DLDB, respectively, are circuits that precharge the data line pair DLDT/DLDB. A PMOS transistor 307 connected between the data line pair DLDT/DLDB and having a gate connected to the output of the NOR circuit 320 is a circuit that equalizes the data line pair DLDT/DLDB.

The data line pair DLDT/DLDB is coupled into first input terminals of NAND circuits 315 and 316, respectively. The output terminals of the NAND circuits 315 and 316 are connected to second input terminals of the NAND circuits 316 and 315, respectively. Output from the NAND circuit 315 is output to an output data terminal Q through an inverter (output buffer) 317. The NAND circuits 315 and 316 form an SR latch (SR flip-flop) which outputs a low-level signal when DLDT is high and outputs a high-level signal when DLDB is high. The SR latch (315, 316) and the inverter (output buffer) 317 constitute an output circuit.

The semiconductor memory device further includes a 2-input AND circuit 318 into which a write enable signal WE which goes high at a write and a one-shot pulse signal (referred to as an "internal clock signal") ICL for RAM internal control are input, a 2-input NOR circuit 321 into which an output signal from the 2-input AND circuit 318 and a sense amplifier activation signal SESI are input, and an inverter 322 which inverts the output from the 2-input NOR circuit 321.

The output of the inverter 322 is connected to the gate of an NMOS transistor 313 out of two NMOS transistors 313 and 314 which are cascode-connected between the sense amplifier 312 and a GND as a signal SES for controlling activation of the sense amplifier 312. An output signal SESB from the 2-input NOR circuit 321 controls on and off of the switch 308.

An output signal from the 2-input NOR circuit 320 into which the internal clock signal ICL inverted by the inverter 319 and a write enable signal WE are input is input into the gates of PMOS transistors 309, 310, and 311 which precharge and equalize the data line pair DLDT/DLDB and also input into the gate of the NMOS transistor 313 out of the two NMOS transistors 313 and 314 cascode-connected between the sense amplifier 312 and the GND to control activation of the sense amplifier 312.

Write data input through an input data terminal is input into a D-type latch circuit 323. The D-type latch circuit 323 latches the write data in synchronization with the rising edge of the internal clock signal ICL. The write data latched in the D-type latch circuit 323 is input into a write buffer 324. The write buffer 324 outputs the input write data as a complementary signal. The output pair of the write buffer 324 is connected to a common data line pair YDT/YDB.

The following provides an overview of operation of the semiconductor memory device in FIG. 6.

Write access will be described first. At write access, the write enable signal WE is driven high. When the internal clock signal ICL is high, the output from the AND circuit 318 is driven high, the output signal SESB from the NOR circuit 321 goes low, the switch 308 is turned off, and the data line pair DLDT/DLDB is disconnected from the common data line pair YDT/YDB. The switch (transfer gate) 308 is formed by, but not limited to, two NMOS transistors (not shown) connected between DLDT and YDT and between DLDB and YDB, respectively, and having gates commonly connected to SESB. The output of the NOR circuit 320 into which a high-level WE is input is low and the NMOS transistor 314 whose gate is connected to the output of the NOR circuit 320 is turned off. Consequently, the sense amplifier 312 is deactivated. The PMOS transistors 309 to 311 whose gates are connected to the output of the NOR circuit 320 are turned on to precharge and equalize the data line pair DLDT/DLDB.

In response to transition of ICL from low to high, the D-type latch circuit 323 latches write data input into the input data terminal D. The write buffer 324 which receives the write data which is single-ended output from the D-type latch circuit 323 differentially outputs the write data to the common data line pair YDT/YDB. The write data differentially output onto the common data line pair YDT/YDB is transmitted to the digit line pair DT/DB of a selected column via a Y selector 304 that is set on by a column select signal and the write data is written in a memory cell connected to a selected word line. Then, ICL drops from high to low and the precharge control signal PC goes low to precharge the digit line pair YDT/YDB.

Read access will be described next. When read access is made, the write enable signal WE is driven low and the output from the AND circuit 318 is driven low. The output signal SESB from the NOR circuit 321 goes high when the sense amplifier activation control signal SESI is low and goes low when SESI is high. That is, when SESI is low, SESB goes high and the switch 308 is turned on to connect YDT with DLDT and connect YDB with DLDB. When SESI is high, SESB goes low and the switch 308 is turned off to disconnect YDT from DLDT and YDB from DLDB. Output SES from the inverter 322 goes high to turn on the NMOS transistor 313. The output from the NOR circuit 320 into which the low-level write enable signal WE is input goes high and turns on the NMOS transistor 314 when ICL is high. When ICL drops from high to low, the output from the NOR circuit 320 goes low to turn off the NMOS transistor 314, turn on the PMOS transistors 309, 310, and 311, and precharge and equalize the data line pair DLDT/DLDB.

That is, when SESI is low in a read cycle, the output SESB from the NOR circuit 321 goes high and the switch 308 turns on. When SESI is high, the output SESB of the NOR circuit 321 goes low, the switch 308 is turned off, and the signal SES applied to the gate of the NMOS transistor 313 is driven high. When ICL is high in this state, the output from the NOR circuit 320 goes high and a high-level signal is applied to both of the gates of the NMOS transistors 313 and 314. Thus, both of the NMOS transistors 313 and 314 are turned on to activate the sense amplifier 312.

A signal (read data) amplified by the sense amplifier 312 and output to the data line pair DLDT/DLDB is latched in the SR latch (315, 316) and then output to the output data terminal through the output buffer 317. Then, when ICL falls low, the output from the NOR circuit 320 goes low and the PMOS transistors 309, 310, and 311 precharge and equalize the data line pair DLDT/DLDB.

Japanese Patent Laid-Open No. 2004-199814 describes a semiconductor memory device including the Write Data Through function or mode which receives write data input through an input data terminal D and directly outputs the write data from the output data terminal Q in a data write operation. The Document discloses a configuration that implements a write through function (Write Data Through function) with a short read time.

Based on the semiconductor memory device circuit shown in FIG. 6, a semiconductor memory device will be considered below that includes the Write Data Through function. The semiconductor memory device including the Write Data Through function has a configuration as shown in FIG. 5, for example. It should be noted that FIG. 5, which has been drawn by the inventor, shows an example of write through control to be compared with the present invention and does not show the conventional art.

Referring to FIG. 5, an output pair of a write buffer 220 which receives write data latched in and output from a D-type latch circuit 219 is connected to a common data line pair YDT/YDB.

In a write operation, an output from the D-type latch circuit 219 is provided to the data line pair YDT/YDB through the write buffer 220 at the rising edge of an internal clock signal ICL and transmitted to a digit line pair DT/DB of a selected column through a Y switch 204 turned on by a column select signal, and is written in a memory cell of a selected word line. When a sense amplifier activation control signal SESI is low, an output from a NAND circuit 218 goes high and a switch (transfer gate) 208, which controls connection between YDT/YDB and DLDT/DLDB to turn on or off, is turned on to bring YDT/YDB, DLDT, and DLDB into conduction. The switch 208 is formed by, but not limited to, two NMOS transistors connected between DLDT and YDT and between DLDB and YDB, respectively, and having gates commonly connected to SESB.

When both SESI and ICL are high, the output signal SESB from the NAND circuit 218 goes low, the switch 208 is turned off, and YDT/YDB and DLDT/DLDB are disconnected. On the other hand, when the output SES from an inverter 217 goes high, an NMOS transistor 213 is turned on, a current is supplied to a sense amplifier 212 to activate the sense amplifier 212, and the sense amplifier 212 outputs the result of sense and amplification to DLDT/DLDB. An SR latch circuit (NAND circuits 214 and 215 having cross-coupled inputs and outputs) which receives a signal from DLDT/DLDB outputs a latched output to an inverter (inverting buffer) 216, and the inverter 216 outputs the inverted signal to an output data terminal Q. That is, the write data from the D-type latch circuit 219 is output from the output data terminal Q through a path indicated by the return arrow in FIG. 5.

When ICL is low or SESI is low, the output from the NAND circuit 218 is driven high, the switch 208 is turned on, and YDT/YDB are connected with DLDT/DLDB. When both SESI and ICL are high in read operation, the output from the NAND circuit 218 goes low, the switch 208 is turned off, and YDT/YDB are disconnected from DLDT/DLDB. The output from the inverter 217 is driven high, the NMOS transistor 213 is turned on, the sense amplifier 212 is activated, and the sense amplifier 212 senses and amplifies the signal from DLDT/DLDB. The SR latch circuit which receives the signal from DLDT/DLDB outputs a latched output to the inverter 216 and the inverter 216 outputs the inverted signal to the output data terminal Q.

FIG. 7 is a timing chart when write and read operations of the semiconductor memory device (RAM) shown in FIG. 5 is performed. In a read operation (Read Cycle), access time is slow because the access passes through a memory cell and is kept waiting until a potential difference greater than or equal to a limit of sense and amplification operation is ensured. tOHR is the time period between the start of the read cycle (the rising edge of an external clock CLK) and the output of read data to the output terminal Q.

On the other hand, in a Write Data Through operation in write operation, access time is fast because input write data is passed directly through to the output data terminal Q without passing through a memory cell. Time tOHW (data hold time) is equal to the time period between the start of a write cycle (rising edge of the external clock CLK) and the output of write data to the output data terminal Q without passing through the memory cell.

That is, in a Write Data Through operation, input write data is transmitted to the output data terminal Q through the write buffer 220 which receives the write data output from the D-type latch circuit 219 in response to the rising edge of an internal clock signal ICL, and through YDT/YDB and DLDT/DLDB. Therefore, the data hold time tOHW is short. On the other hand, in a read operation, the sense amplifier 212 is activated and then a change occurs at the output data terminal Q after the rising edge of SESI. Therefore, data hold time tOHR is longer than that in a write operation.

Since a write operation in which the access time is relatively fast is performed after a read operation in which access time is relatively slow in the configuration shown in FIG. 5, the valid range of input data on a chip (CPU or controller) side is extremely reduced when intermittent read and write operations or alternating read and write operations are performed. That is, the time period during which write data is output and held on a data bus connecting to the semiconductor memory device (RAM) on the chip (CPU or controller) side is extremely short in a Write Data Through operation. Consequently, timing margin of chip design is extremely small.

Furthermore, in order to meet specifications of different semiconductor memory devices (RAMs), hardware of the RAMs must be individually designed. RAMs that meet customers' specifications must be individually designed. Accordingly, the load of designing RAMs increases.

SUMMARY

In one embodiment, a semiconductor memory device includes, a data write circuit receiving a write data, a sense amplifier coupled to a data line, an output data terminal coupled to the data line, a switch coupled between the data write circuit and the data line; and a control circuit which turns on the switch based on a write control signal and a sense amplifier activation control signal during a write data through mode. The time required for an inputted write data to be output from the output data terminal via the switch during the write data through mode in a write cycle and the time required for read data from a memory cell to be output from the output data terminal in a read cycle are substantially equalized with each other.

In another embodiment, a semiconductor memory device includes, at least one digit line pair coupled to at least one memory cell, a read data line pair, an output data line pair, a first switch coupled between the read data line pair and the output data line pair, an output circuit coupled to the output data line pair, an output data terminal coupled to the output circuit, a data input terminal receiving a write data, a write buffer which receives the write data, a write data line pair connected to the write buffer, a Y switch connecting the digit line pair with the read data line pair in a read operation and connecting the digit line pair with the write data line pair in a write operation, and a second switch coupled between the write data line pair and the output data line pair to electrically connect the write data line pair and the output data line pair during a write data through mode.

In another embodiment, a semiconductor device includes an internal clock generator responsive to an external clock, a chip select signal, a write enable signal and a write data through signal to generate at least a read internal clock signal and a write internal clock signal.

The present invention facilitates the timing design of a semiconductor memory device including a Write Data Through mode or function and of a chip connected to the semiconductor memory device, by a configuration that equalizes access time in a read operation with access time in a write operation.

According to the present invention, selection between enablement and disablement of a Write Data Through specification can be made in a single semiconductor memory device.

BRIEF DESCRIPTION OF THE DRAWINGS

The above and other aspects, advantages and features of the present invention will be more apparent from the following description of certain exemplary embodiments taken in conjunction with the accompanying drawings, in which.

DETAILED DESCRIPTION OF THE EXEMPLARY EMBODIMENT

According to the present invention, a switch (125) is provided that turns on or off connection between a write data line pair (WDT/WDB) to which an output pair of a write buffer (122) is connected and a data line pair (DLDT/DLDB) to which a sense amplifier (114) is connected. A circuit (see FIG. 2) that generates a one-shot pulse signal (WICL) which is activated at a write operation when a Write Data Through specification is enabled is provided. Circuits (123, 124) are provided that receive WICL and a sense amplifier activation signal (SESI) and, when both of the signals are active, turn on the switch (125). Thus, the data hold time tOHW in a write operation when the Write Data Through specification is enabled can be made approximately equal to the data hold time tOHR in a read operation.

Figure 2:
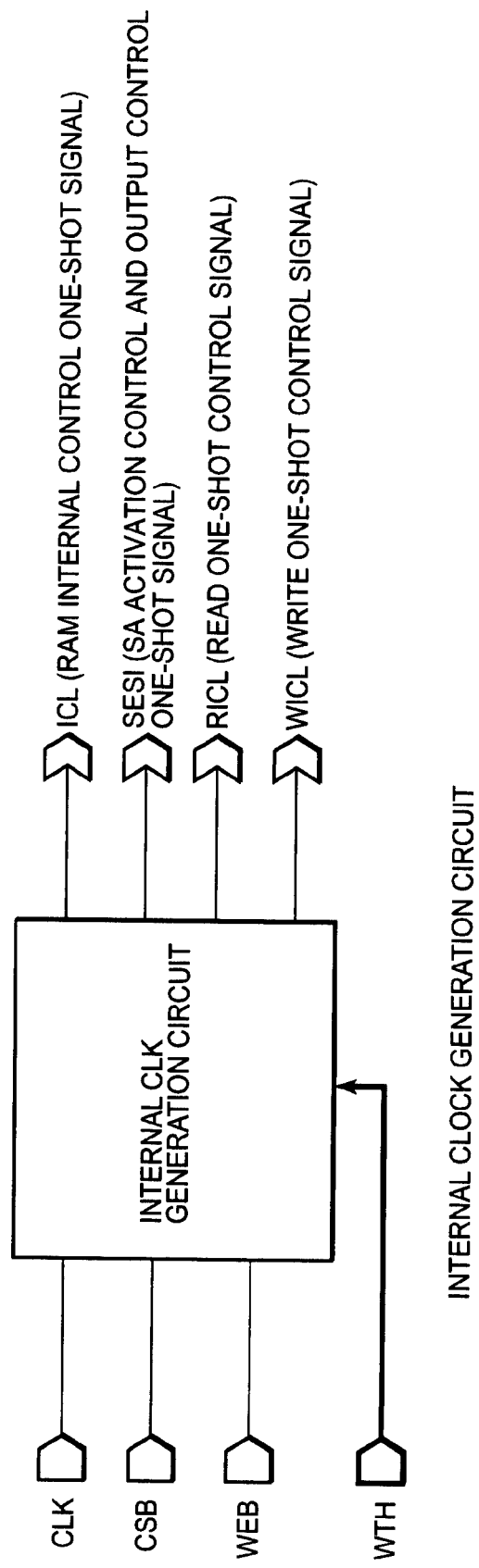
FIG. 2 is a diagram showing input terminals and output clock terminals of an internal CLK generation circuit according to an embodiment of the present invention.

By providing a mechanism (switching based on the signal level at the WTH terminal shown in FIG. 2 or switching measures using a fuse or the like) that enables selection between two different specifications (enablement and disablement of a Write Data Through function) for the RAM, two different specifications of the RAM can be implemented in the single circuit. The present invention will be described below with respect to a specific embodiment.

Figure 1:
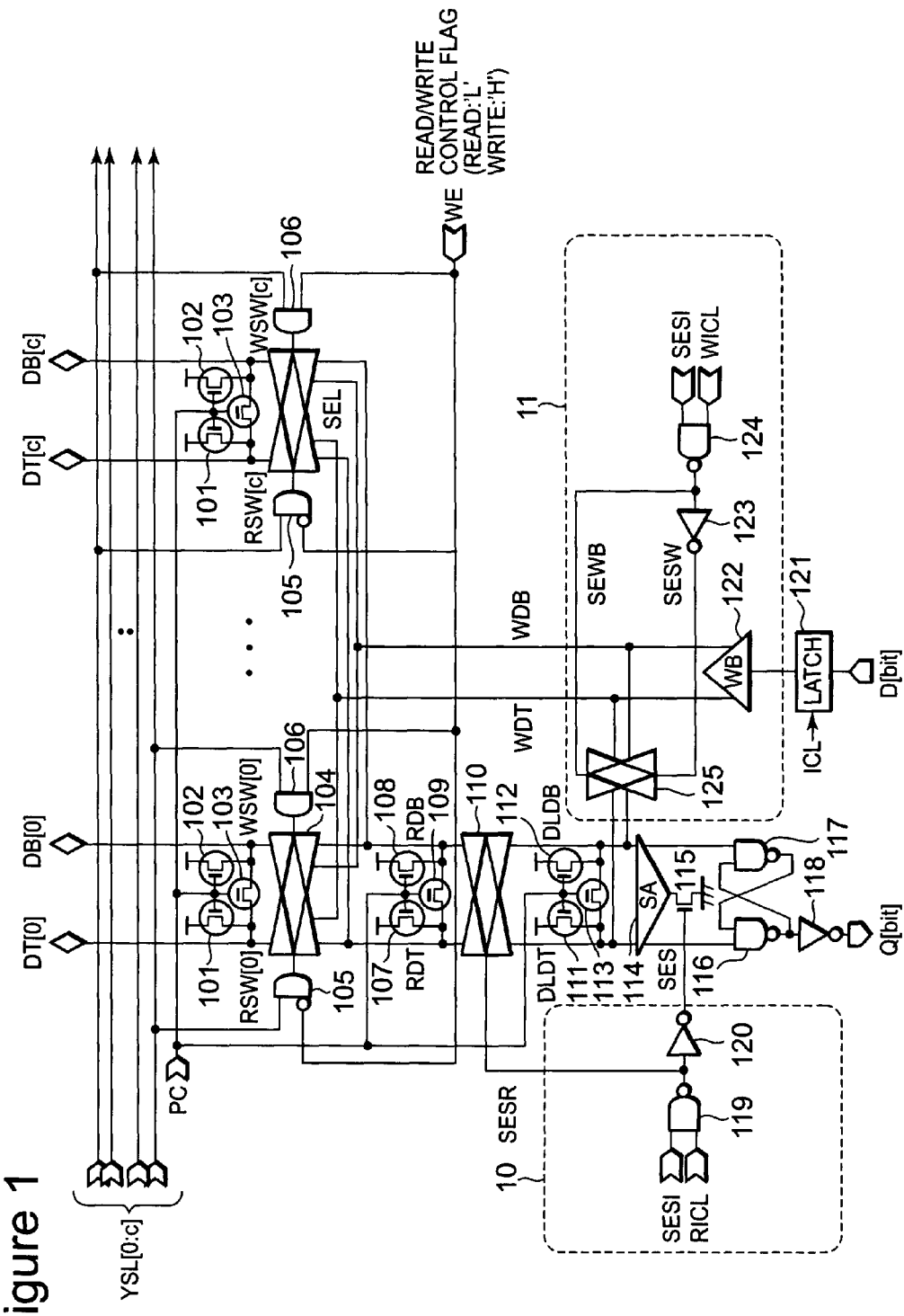
FIG. 1 is a diagram showing a configuration according to an embodiment of the present invention.

FIG. 1 shows a configuration of a semiconductor memory device (RAM) according to one embodiment of the present invention. For a basic operation of the present embodiment, a control signal (a read one-shot pulse signal) RICL for controlling an output in a data read circuit and a control signal (write one-shot pulse signal) WICL for controlling an input in a data write circuit are separately provided. A control circuit 10 that controls an output in accordance with the control signal RICL and a control circuit 11 that controls an input in accordance with the control signal WICL when the Write Data Through function is enabled (when the input level at the terminal WTH in FIG. 2 is high) are provided. When the Write Data Through function is enabled, the control circuit 11 turns on a switch 125 to transmit data from an output pair WDT/WDB of a write buffer 122 onto a data line pair DLDT/DLDB of a sense amplifier 114 in accordance with WICL and a sense amplifier activation signal SESI. With this configuration, the amounts of output data hold time of the RAM (tOHR in a read operation and tOHW in a write operation) are equalized to facilitate timing design in chip design for a Write Data Through specification. On the other hand, when the Write Data Through function is disabled (when the input level at WTH is low), WICL is held low to turn off the switch 125, thereby preventing input write data from propagating to an output data terminal Q.

More specifically, referring to FIG. 1, PMOS transistors 101 and 102 having sources connected in common to a power source, gates connected in common to a precharge control signal PC, and drains connected to a pair of digit lines DT and DB, respectively, are circuits which precharge the digit line pair DT/DB. A PMOS transistor 103 connected between the digit lines DT and DB and having a gate connected to a precharge control signal PC is a circuit that equalizes a digit line pair DT/DB. Multiple Y selectors (Y switches) 104, each of which is brought into or out of conduction by corresponding one of c+1 column select signals YSL [0:c] output from a column decoder, not shown, are connected to a common read data line pair RDT/RDB and a common write data line pair WDT/WDB.

PMOS transistors 107 and 108 having sources connected to a power source, gates connected in common to the precharge control signal PC, and drains connected to a pair of read data lines RDT and RDB, respectively, are circuit that precharge the read data line pair RDT/RDB. A PMOS transistor 109 connected between the read line pair RDT/RDB and having a gate connected to the precharge control signal PC is a circuit that equalizes the read data line pair RDT/RDB. The read data line pair RDT/RDB and the data line pair DLDT/DLDB connecting to a sense amplifier 114 are interconnected through a switch (transfer gate) 110.

PMOS transistors 111 and 112 having sources connected in common to a power source, gates connected in common to the precharge control signal PC, and drains connected to the data lines DLDT and DLDB, respectively, are circuits that precharge the data line pair DLDT/DLDB. A PMOS transistor 113 connected between the data lines DLDT and DLDB and having a gate connected to the common precharge control signal PC is a circuit that equalizes the data line pair DLDT/DLDB.

The data line pair DLDT/DLDB connected to the sense amplifier 114 is input into an SR latch circuit (consisting of NAND circuits 116 and 117 having cross-coupled inputs and outputs). An output from the SR latch circuit (116, 117) is provided to the output data terminal Q through the output circuit formed by an inverting buffer 118. The SR latch circuit (116, 117) and the inverter (output buffer) 318 constitute an output circuit.

Connected between the sense amplifier 114 and a GND is an NMOS transistor 115 having a gate connected with a control signal SES. When the control signal SES is high, the sense amplifier 114 is activated. The switch 110 is not limited to but formed by an NMOS transistors (transfer gates) connected between DLDT and RDT and between DLDB and RDB and having gates connected to common SESR.

A control circuit 10 for read includes a 2-input NAND circuit 119 into which a sense amplifier activation signal SESI and a read one-shot pulse signal RICL are input and an inverter 120 which inverts an output SESR from the 2-input NAND circuit 119. The output signal SESR of the 2-input NAND circuit 119 is input into the switch 110. The output signal SES of the inverter 120 is input into the gate of an NMOS transistor 113. In a read operation, when SES is high, SESR goes low, the switch 110 turns off, the NMOS transistor 115 turns on, the sense amplifier 114 is activated and then senses and amplifies the signals on the data line pair DLDT/DLDB with RDT/RDB and DLDT/DLDB being disconnected from each other.

The present embodiment further includes a D-type latch circuit 121 which latches write data from an input data terminal D in response to an internal clock signal ICL, and a write buffer 122 which receives the write data single-ended output from the D-type latch circuit 121 and outputs the write data to a write data line pair WDT/WDB to drive the write data line pair WDT/WDB. The D-type latch circuit 121 latches write data in response to the rising edge of ICL, but not limited to this.

A control circuit 11 for write includes a NAND circuit 124 into which a sense amplifier activation control signal SESI and a write one-shot pulse signal WICL are input, and a switch 125 which turns on and off connection between the write data line pair WDT/WDB and the data line pair DLDT/DLDB. The switch 125 is turned on or off by an output signal SEWB from the NAND circuit 124 and an output signal SESW from an inverter 123 which receives an output from the NAND circuit 124. When the output SEWB from the NAND circuit 124 is low, the switch 125 turns on; when the output SEWB is high, the switch 125 turns off. The switch 125 turns on or off transmission of data on the write data lines WDT/WDB of the data write circuit onto the data line pair DLDT/DLDB connected to the sense amplifier 114 of the data read circuit. The switch 125 is implemented by, but not limited to, a CMOS transfer gate connected between WDT and DLDT and including a PMOS transistor and an NMOS transistor having gates into which SEWB and SESW, respectively, are input and a CMOS transfer gate connected between WDB and DLDB and including a PMOS transistor and an NMOS transistor having gates into which SEWB and SESW, respectively, are input.

The present embodiment further includes an AND circuit 106 that inputs a write enable signal WE that is driven high during write and a column select signal YSW [i] (where i is an integer in the range from 0 to c) into each Y switch 104, and an AND circuit 105 that inputs the inversion (which is an active-low signal) of the write enable signal WE and the column select signal YSW [i] into each Y switch 104. At a write operation, the output WSW [i] from the AND circuit 106 corresponding to a selected Y switch 104 goes high, the output RSW [i] from the AND circuit 105 goes low, and the selected digit line pair DT/DB is connected with the write data line pair WDT/WDB. At a read operation, on the other hand, the output WSW [i] from the AND circuit 106 corresponding to a selected Y switch 104 goes low, the output RSW [i] from the AND circuit 105 goes high, and the selected digit line pair DT/DB is connected to the read data line pair of RDT and RDB. The Y switch 104 may include, but not limited to, an NMOS transistor (not shown) connected between the digit lines DT and WDT and having a gate connected to WSW [i] (where i is an integer in the range from 0 to c), an NMOS transistor (not shown) connected between the digit line DT and RDT and having a gate connected to RSW [i] (where i is an integer in the range from 0 to c), an NMOS transistor (not shown) connected between the digit lines DB and WDB and having a gate connected to WSW [i] (where i is an integer in the range from 0 to c), and an NMOS transistor (not shown) connected between the digit lines DB and RDB and having a gate connected to RSW [i] (where i is an integer in the range from 0 to c).

FIG. 2 shows signal terminals of an internal clock (CLK) generation circuit that generates various control signals shown in FIG. 1. The internal CLK generation circuit has input terminals for an external clock signal CLK, a chip select signal CSB (an active-low signal), a write enable signal WEB (active-low), and a control signal WTH for selecting enablement/disablement of the Write Data Through function. The internal CLK generation circuit generates a RAM internal control one-shot pulse signal (internal clock signal) ICL, a sense amplifier control and output control one-shot pulse signal (sense amplifier activation control signal) SESI, a read one-shot pulse signal RICL, and a write one-shot pulse signal WICL. It should be noted that the write enable signal in FIG. 1 is the inversion of the write enable signal WEB.

In the present embodiment, the Write Data Through function is enabled when the input terminal WTH is high. When WTH is low, the Write Data Through function is disabled and write data input through the input data terminal D is not output from the output data terminal Q.

Figure 3:
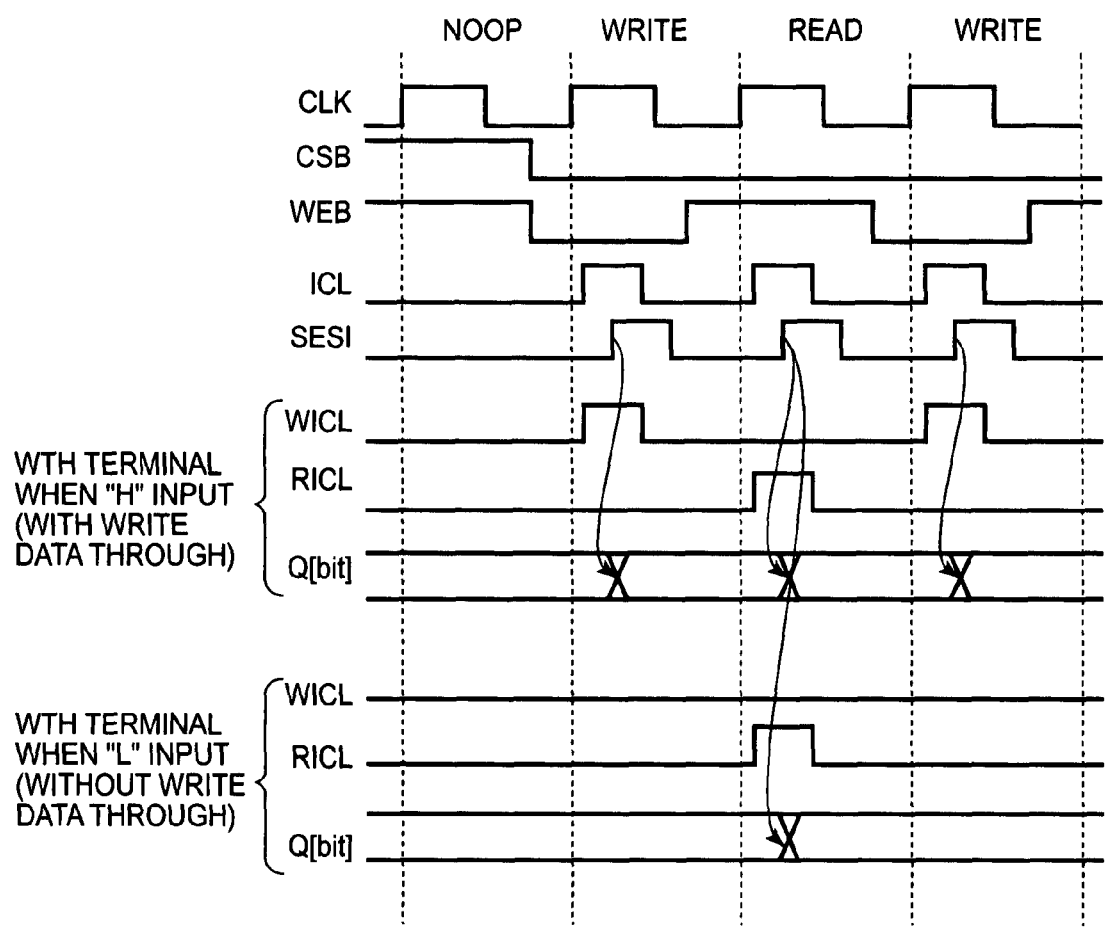
FIG. 3 is a timing chart showing operation of an internal CLK generation circuit according to an embodiment of the present invention.

FIG. 3 is a timing chart illustrating operation of the internal CLK generation circuit shown in FIG. 2. In a write cycle, when the WTH terminal is high (the Write Data Through function is enabled), the internal CLK generation circuit drives SESI high in accordance with ICL and outputs a write one-shot pulse WICL in accordance with low-level WEB. When SESI and WICL are high, the output from the NAND circuit 124 in FIG. 1 goes low, the switch 125 turns on, and write data on the write data line pair WDT/WDB is output through the output data terminal Q.

When the WTH terminal is low (the Write Data Through function is disabled), the internal CLK generation circuit does not generate a one-shot pulse WICL, WICL is forced low, the output from the NAND circuit 124 goes high, the switch 125 turns off, and write data on the write data line pair WDT/WDB is not output through the output data terminal Q.

In a read operation, the internal CLK generation circuit generates a one-shot pulse RICL, the NAND circuit 116 goes low, the output from the inverter 117 goes high, the sense amplifier 114 is activated to sense and amplify read data from a memory cell and output the amplified read data through the output data terminal Q.

Figure 4:
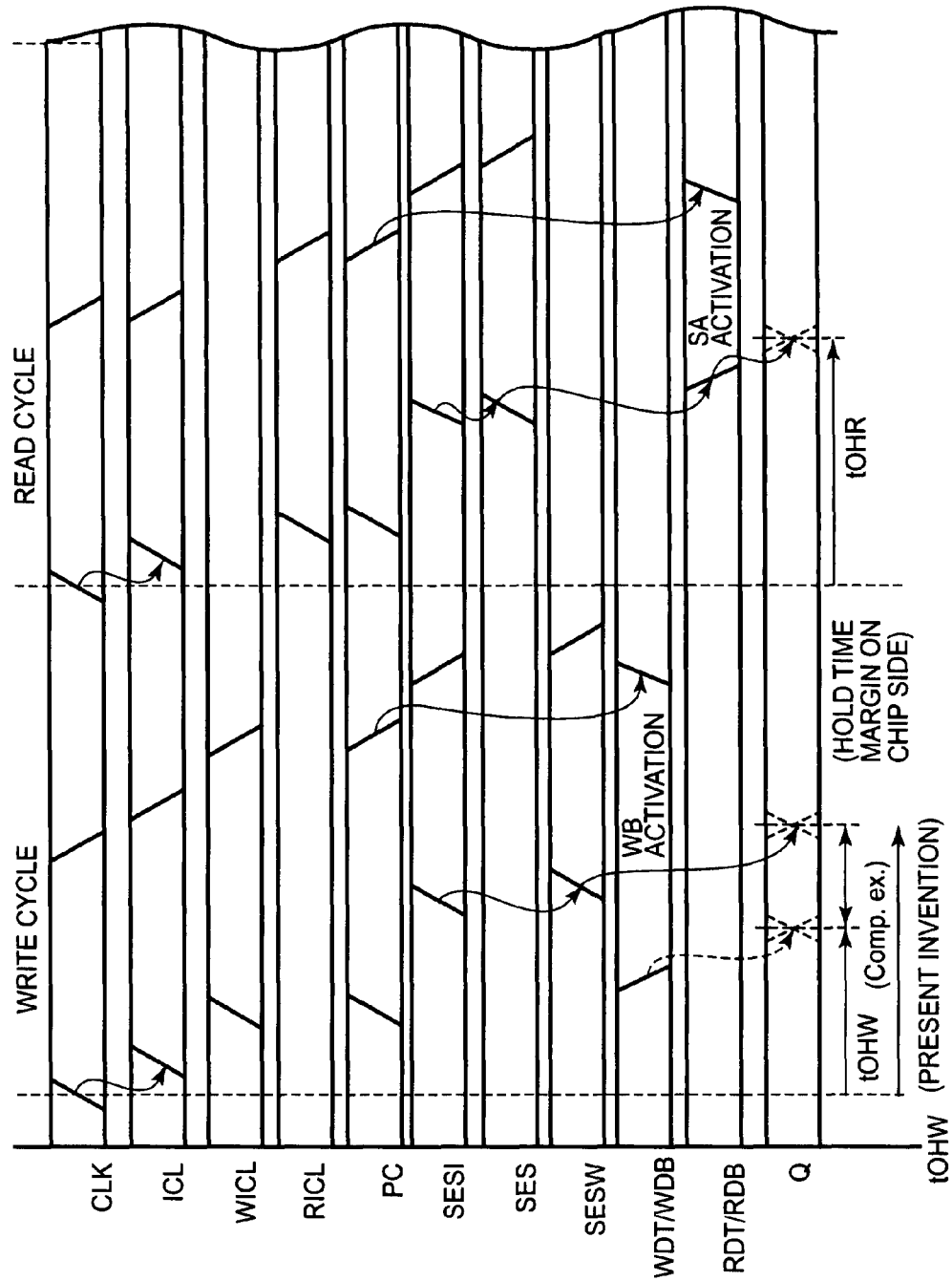
FIG. 4 is a timing chart showing operation at write access and read access according to an embodiment of the present invention.

FIG. 4 is a timing chart of a write operation and a read operation during Write Data Through in the present embodiment.

In a write cycle, WICL is driven high. In response to this transition, the sense amplifier activation control signal SESI goes high and SESW goes high in accordance with the rising edge of SESI. The switch 125 turns on, the signal on the write data line pair WDT/WDB is latched in the SR latch circuit (116, 117) and then is output through the output data terminal Q. In the write cycle, RICL is low and therefore the output from the NAND circuit 119 is high, the switch 110 is turned on, the output from the inverter 120 goes low, and the NMOS transistor 115 is turned off to deactivate the sense amplifier 114.

Figure 5:
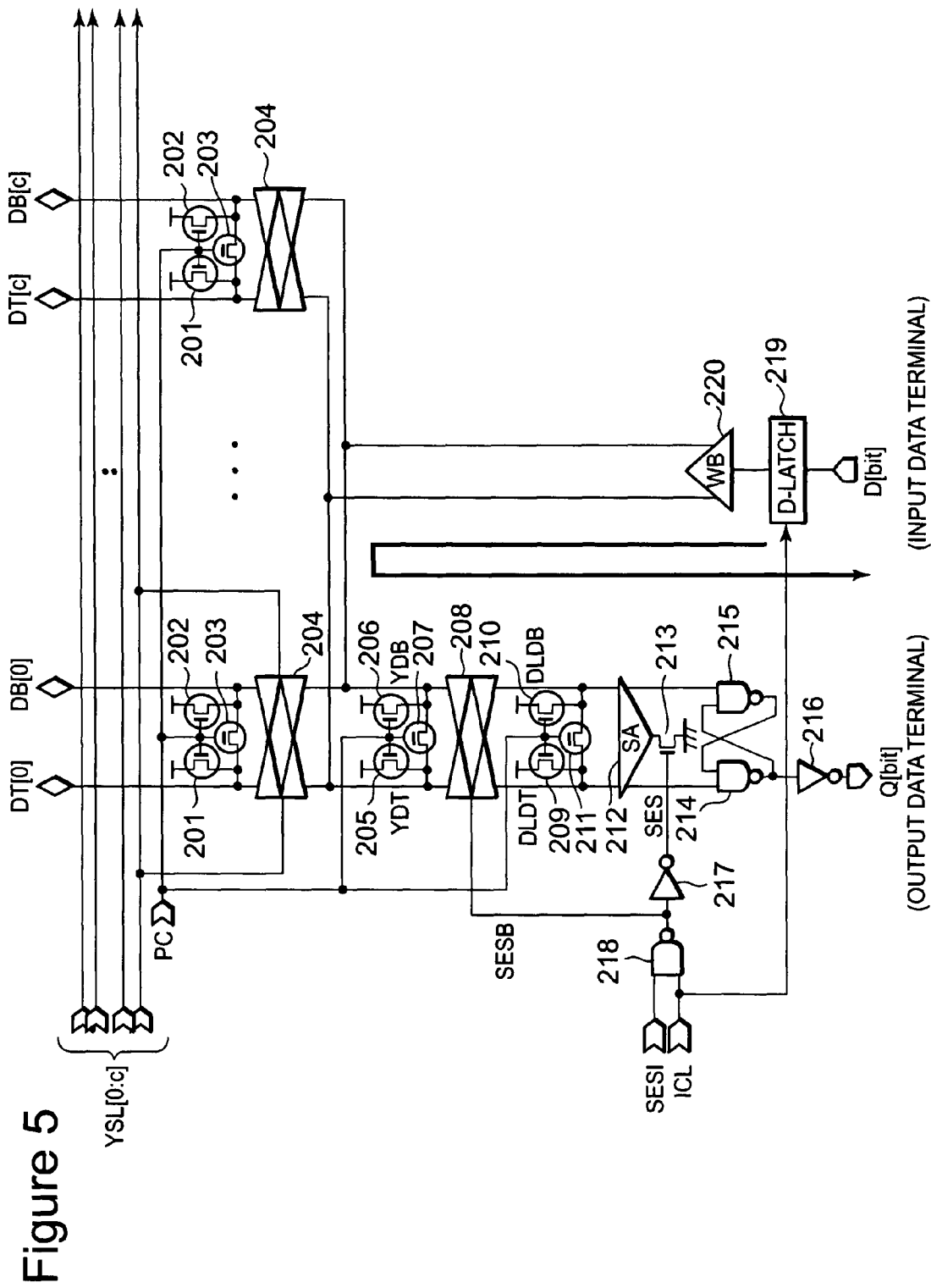
FIG. 5 is a diagram showing a configuration (comparative example) including a Write Data Through function.
Figure 6:
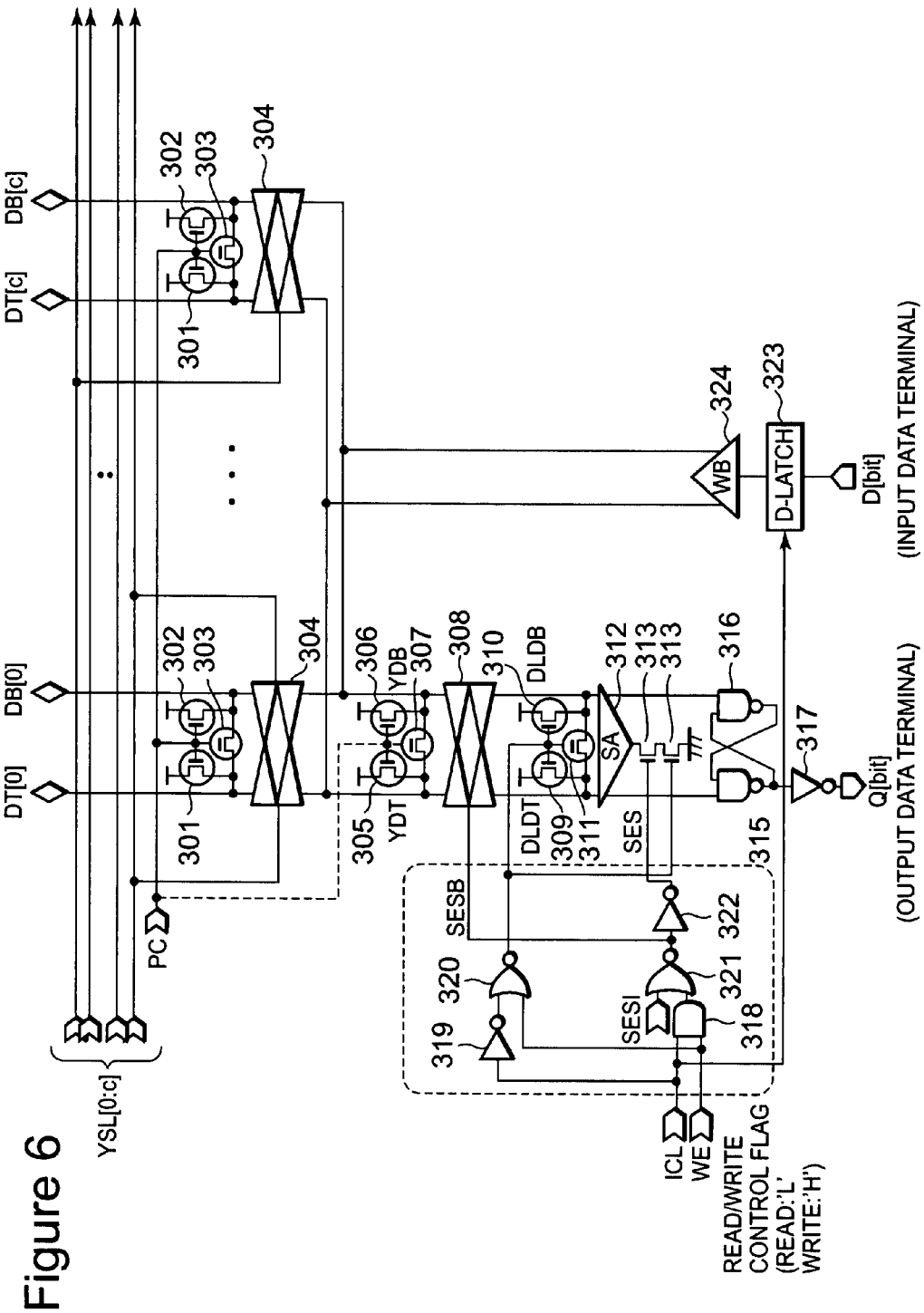
FIG. 6 is a diagram showing an exemplary configuration of a conventional semiconductor memory device.
Figure 7:
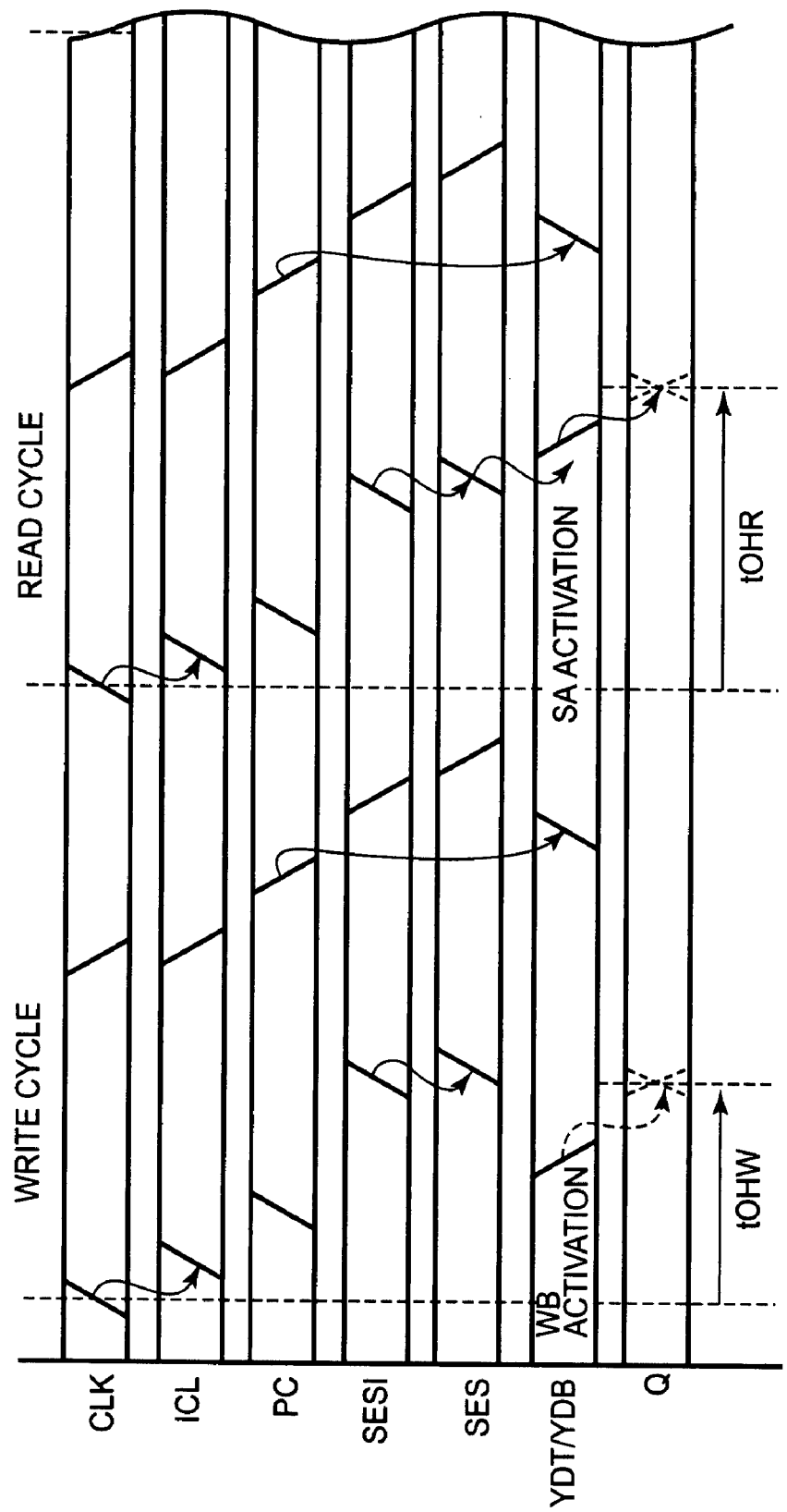
FIG. 7 is a diagram illustrating operation of the comparative example shown in FIG. 5.

As shown in FIG. 4, tOHW (the present invention) during write access is longer than tOHW (comparative example, corresponding to tOHW in FIG. 5) and is approximately equal to the value of tOHR during read access. In FIG. 4, the time equal to tOHW (present invention) minus tOHW (comparative example) is the timing margin of the hold time on the chip side.

In a read cycle, RICL is forced high. When SESI is high, the output from the NAND circuit 119 is forced low, the switch 110 is turned off, and RDT/RDB are disconnected from DLDT/DLDB. The output from the inverter 120 goes high, NMOS transistor 115 is turned on, the sense amplifier 114 is activated, the signal on the data line pair DLDT/DLDB (DLDT/DLDB is connected to RDT/RDB and stores signal charge when switch 110 is turned on) is sensed and amplified, is latched in the SR latch circuit (116, 117), and is then output from the output data terminal Q through the inverting buffer 118. Then, the precharge signal PC is forced low and the digit line pair and data line pair are precharged and equalized.

The output data hold timings in the write operation and the read operation (tOHW in the write operation and tOHR in the read operation) become an approximately equal specification value from the rising edge of the sense amplifier activation control signal SES.

According to the present embodiment, by controlling the write control clock (WICL) using the value of the terminal WTH during a write operation, two different RAM specifications, namely the Write Data Through function enabled state and the Write Data Through function disabled state, can be implemented in a single device.

In the case of a RAM specification that specifies that data input in the RAM should be directly transmitted to the output terminal in a write operation, the range of output of the RAM, in other words the range of valid input for a chip, can be increased by equalizing the output data hold times (tOHW and tOHR) during write and read operations. Thus, the timing design in chip design can be made easier.

According to the present embodiment, quick delivery of RAMs that meets customer's specifications can be accomplished.

From the viewpoint of a chip designer, any RAM macro specification can be flexibly chosen by clamping the input terminal WTH in the semiconductor memory device (RAM) according to the present embodiment.

A Write Data Through specification may be used when one wants to take in write data in synchronization with the next clock cycle.

A Non-Write Data Through specification in which input data is not output through the output terminal during a write operation of a RAM may be used in a case where data read into a CPU is used without change, such as a case where normal operation is to be restored after completion of an interruption to the CPU. This is advantageous in that an output current from the RAM associated with output data switching during a write operation can be controlled.

From the viewpoint of a RAM designer, two different specifications for a semiconductor memory device (RAM), which conventionally have been met by separate hardware designs, can be implemented in a single circuit simply by switching the input state of the WTH terminal if the circuit configuration of the present embodiment is preinstalled in the semiconductor memory device (RAM). Thus, the number of man-hours of RAM designers can be reduced as compared with cases where circuits are separately designed.

In the case of ASIC (Application Specific Integrated Circuit) products targeted at various customers, it is advantageous to provide a wide range of RAMs suitable for customers' products and applications since this enables flexible and quick delivery of RAMs. The present invention makes such delivery possible because of the commonality of the output control logic between write and read operations of a RAM.

Furthermore, while conventionally separate designs have been made in order to meet requirements of RAMs having different specifications, the present invention enables flexible delivery of a RAM suitable for customer's application simply by providing a circuit in the RAM beforehand and changing the level of the input terminal. It will be understood that switching between RAM specifications may be made by using a fuse or the like instead of the switching of the input terminal WTH.

The memory cell array of the semiconductor memory device may be a static random access memory or a dynamic random access memory that requires refreshing for holding data. While the present invention has been described with respect to the above embodiment, the present invention is not limited to the specific configuration of the embodiment. It will be understood that the present invention includes any variations and modifications that can be made by those skilled in the art without departing from the scope of the present invention.

A semiconductor memory device according to the present invention includes: a switch which turns on or off transmission of write data input in a data write circuit to a data line connecting to a sense amplifier of a data read circuit; and a circuit which performs control to turn on the switch when both of a write control signal which is activated in a write operation and a sense amplifier activation control signal which controls activation of the sense amplifier are active while a Write Data Through function is enabled; wherein the time required for input write data to be through-output from an output data terminal in a write cycle and the time required for read data from a memory cell to be output from the output data terminal in a read cycle are equalized with each other.

According to the present invention, in a read cycle, the read data is output from the output data terminal after a predetermined period of time has elapsed after transition of the sense amplifier activation control signal to an active state; and in a write cycle, the write data is through-output from the output data terminal after a period of time approximately equal to the predetermined period of time in the read access has elapsed after transition of the sense amplifier activation control signal to the active state when the Write Data Through function is enabled.

According to the present invention, a signal generation circuit is provided which activates and outputs the write control signal in a write operation when the Write Data Through function is enabled.

According to the present invention, the signal generation circuit holds the write control signal in an inactive state in a write operation when the Write Data Through function is disabled.

According to the present invention, the signal generation circuit controls whether the write control signal is to be activated or not, on the basis of a value of an input terminal which indicates whether the Write Data Through function is enabled or disabled or on the basis of whether a fuse is melt.

According to the present invention, the switch is connected between a write data line which is an output of a write buffer in which write data is input and a data line of the sense amplifier.

According to the present invention, the semiconductor memory device includes a plurality of sets of a digit line pair with which a plurality of memory cells are connected and a Y switch which is connected to the digit line pair and turned on or off by a corresponding column select signal; a read data line pair to which the plurality of Y switches are connected in common; and a data line separation switch which turns on or off connection between the read data line pair and one end of a data line pair which connects to the sense amplifier. The other end of the data line pair which connects to the sense amplifier is connected to an output circuit, and an output of the output circuit is connected to an output data terminal. The semiconductor memory device includes a latch circuit which latches write data input into an input data terminal in response to a latch timing signal; a write buffer into which write data from the latch circuit is input and which outputs the write data to an output pair; and a write data line pair connected to the output pair of the write buffer. The plurality of Y switches are connected to the write data line pair in common. The Y switch selected by the column select signal connects the digit line pair to the read data line pair in a read operation and connects the digit line pair to the write data line pair in a write operation. The semiconductor memory device includes a logic circuit which outputs the result of a logical operation between the sense amplifier activation control signal and the write control signal. The switch may turn on or off connection between the write data line pair and the data line pair connecting to the sense amplifier on the basis of an output signal from the logic circuit.

While the invention has been described in terms of several exemplary embodiments, those skilled in the art will recognize that the invention can be practiced with modification within the spirit and scope of the appended claims.

Further, it is noted that, Applicant's intent is to encompass equivalents of all claim elements, even if amended later during prosecution.

What is claimed is:

1. A semiconductor memory device, comprising:
    a data write circuit which receives a write data;
    a sense amplifier coupled to a data line;
    an output data terminal coupled to said data line;
    a switch coupled between said data write circuit and said data line;
    a control circuit which turns on said switch based on a write control signal and a sense amplifier activation control signal during a write data through mode;
    at least one digit line pair coupled to at least one memory cell;
    a read data line pair;
    a Y switch coupled between said digit line pair and said read data line pair;
    a data line separation switch coupled between said read data line pair and said data line pair connected to said sense amplifier;
    an output circuit coupled to said data line pair connected to said sense amplifier;
    an output data terminal coupled to said output circuit;
    a latch circuit which latches write data input into an input data terminal;
    a write buffer which receives and outputs said write data; and
    a write data line pair connected to said write buffer;
    wherein:
        said Y switch is connected to said write data line pair;
        said Y switch connects said digit line pair to said read data line pair in a read operation, and connects said digit line pair to said write data line pair in a write operation; and
        said switch connects said write data line pair and said data line pair connected to said sense amplifier, during said write data through mode.

2. A semiconductor memory device, comprising:
    at least one digit line pair coupled to at least one memory cell;
    a read data line pair;
    an output data line pair;
    pair;
    a first switch coupled between said read data line pair and said output data line an output circuit coupled to said output data line pair;
    an output data terminal coupled to said output circuit;
    a data input terminal which receives a write data;
    a write buffer which receives said write data;
    a write data line pair connected to the said write buffer;
    a Y switch which connects said digit line pair with said read data line pair in a read operation, and connects said digit line pair with said write data line pair in a write operation; and
    a second switch coupled between said write data line pair and said output data line pair to electrically connect said write data line pair and said output data line pair during a write data through mode.

3. The device according to claim 2, wherein said signal generation circuit holds said write control signal in an inactive state during a non-write data through mode.

4. The device according to claim 2, further comprising a signal generation circuit which activates a write control signal during said write data through mode so that said second switch is controlled based on said write control signal.

5. The device according to claim 4, wherein said signal generation circuit outputs a one-shot pulse as said write control signal.

6. The device as claimed in claim 4, wherein said signal generation circuit is responsive to an external clock, a chip select signal, a write enable signal and a write data through signal to generate at least a read internal clock signal and a write internal clock signal.

7. A semiconductor device, further comprising:
an internal clock generator responsive to an external clock, a chip select signal, a write enable signal and a write data through signal to generate at least a read internal clock signal and a write internal clock signal;
a write data line which transmits a write data;
an output data line which transmits a read data to be outputted from an output terminal;
a switch connected between said write data line and said output data line to electrically connect said write data line with said output data line based on said write internal clock signal; and
a sense amplifier to amplify said read data on said output data line, based on said read internal clock signal,
wherein said switch and said sense amplifier are further controlled by a sense amplifier enable signal which is formed in said internal clock generator.

* * * * *